VERY HIGH FREQUENCY TUNER CONVERTIBLE TO INTERMEDIATE FREQUENCY AMPLIFIER
Filed Nov. 29, 1955
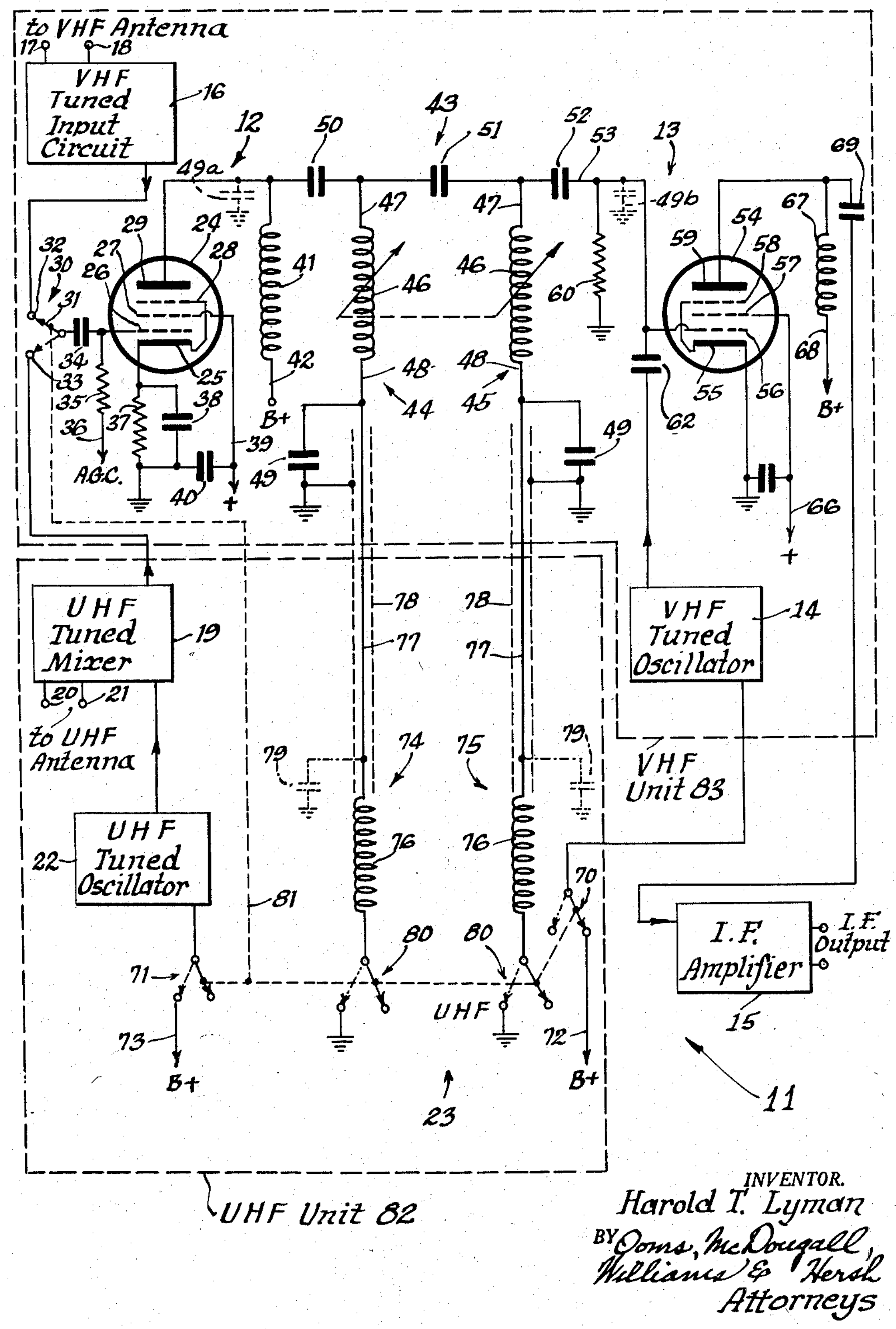
INVENTOR.
Harold T. Lyman
BY Toms, McDougall, Williams & Hersh
Attorneys 2,873,360
Patented Feb. 10, 1959

2,873,360

VERY HIGH FREQUENCY TUNER CONVERTIBLE TO INTERMEDIATE FREQUENCY AMPLIFIER

Harold T. Lyman, Milford, Conn., assignor to Aladdin Industries, Incorporated, Nashville, Tenn., a corporation of Illinois Application November 29, 1955, Serial No. 549,793

7 Claims. (Cl. 250—20)

This invention relates to radio frequency tuners, particularly those of the type adapted to cover the commercial television bands or other similar frequency ranges.

One principal object of the present invention is to provide a new and improved tuner having band transfer means for lowering the operating frequency of a radio frequency amplifier or the like so that the amplifier will serve as an intermediate frequency amplifier in a portion of the tuning range.

A further object is to provide a new and improved television tuner having radio frequency amplifier and mixer stages tunable over the very high frequency (V. H. F.) television bands extending from 470 to 890 megacycles, together with novel band transfer means for lowering the operating frequency of the amplifier and mixer stages so that they will serve as additional intermediate frequency amplifiers to receive the output of a second mixer adapted to cover the ultra high frequency (U. H. F.) television band extending from 470 to 890 megacycles.

It is another object to provide new and improved band transfer means of the foregoing character which may be embodied in a supplementary U. H. F. tuning unit separate from the radio frequency amplifier and mixer stages without any substantial sacrifice of performance due to factors such as the use of elongated leads.

It is a further object to provide new and improved band transfer means which require a minimum of switching contacts in a simple and highly efficient arrangement.

Further objects and advantages of the invention will appear from the following description, taken with the accompanying drawing, in which the single figure is a schematic wiring diagram of an all band television tuner or the like constituting an illustrative embodiment of the present invention.

If considered in greater detail, the drawing will be seen to illustrate an all band tuner 11 constituting the signal receiving portion of a television receiver adapted to cover both the U. H. F. and the V. H. F. television bands. In general, the tuner 11 comprises a radio frequency amplifier 12 which is tunable over the V. H. F. television bands, or any similar range of frequencies. The output of the radio frequency amplifier 12 is supplied to a V. H. F. mixer stage 13, which also receives the output of a V. H. F. local oscillator 14. By the well known superheterodyne method the V. H. F. signals are converted in the mixer 13 to intermediate frequency signals of a predetermined, fixed intermediate frequency, such as 43.5 or 22 megacycles. The intermediate frequency signals are fed to an intermediate frequency amplifier 15. The succeeding stages of the radio receiver, that are adapted to utilize the signals from the intermediate frequency amplifier, may be of any known or suitable construction and need not be illustrated or described.

For V. H. F. operation, the radio frequency amplifier 12 receives its input from a tunable input circuit 16 having input terminals 17 and 18 adapted to be connected to a V. H. F. antenna. For U. H. F. operation, the input of the amplifier 12 is connected instead to the output of a U. H. F. superheterodyne mixer 19 having input terminals 20 and 21 adapted to be connected to a U. H. F. antenna. The U. H. F. mixer 19 receives the output of a U. H. F. local oscillator 22 which produces signals of a frequency such as to convert the U. H. F. signals to the operating frequency of the intermediate frequency amplifier 15. In accordance with the invention, band transfer means 23 are provided to convert the radio frequency amplifier 12 and the mixer 13 into additional intermediate frequency amplifiers for U. H. F. operation. The construction and operation of the band transfer means will be described in detail shortly.

While the radio frequency amplifier 12 may be of any known or suitable construction, it will be of interest to note that the illustrated amplifier comprises an amplifying device which happens to take the form of a pentode electron discharge tube 24 having a cathode 25, a control grid 26, a screen grid 27, a suppressor grid 28 and a plate or anode 29. A transfer switch 30 is provided to connect the control grid 26 to either the V. H. F. input circuit 16 or the U. H. F. mixer 19. It will be seen that the switch 30 comprises a contact 31 which is movable between fixed contacts 32 and 33 connected to the V. H. F. input circuit 16 and the U. H. F. mixer 19, respectively. A coupling capacitor 34 is connected between the movable contact 31 and the control grid 26. In the usual manner, a grid return resistor 35 is connected between the grid 26 and a lead 36 extending to a source of automatic gain control voltage.

The cathode 25 of the tube 24 is connected directly to the suppressor grid 28 and is connected to ground through a self biasing resistor 37 bridged by a bypass capacitor 38. A lead 39 extends from the screen grid to a suitable source of positive screen grid potential. It will be seen that a bypass capacitor 40 is connected between the screen grid 27 and ground.

Plate voltage is supplied to the plate 29 by means of a radio frequency choke coil 41 connected between the plate and a lead 42 extending to a suitable source of positive plate potential.

A tunable coupling circuit 43 is provided to couple the output of the amplifier stage 12 to the input of the mixer stage 13. The coupling circuit 43 may be varied in construction but is shown as including twin resonant circuits 44 and 45. For the most part, the following discussion will be directed to the resonant circuit 44 inasmuch as the two circuits 44 and 45 are virtually identical.

It will be seen that each of the resonant circuits 44 and 45 comprises a main inductance coil 46 having end leads 47 and 48. The lead 47 serves as the high potential terminal of the resonant circuit. In this instance, a capacitor 49 is connected between the other end lead 48 and ground. Thus, the low potential terminal of the resonant circuit is grounded. The coil 46 is resonated by its own distributed capacitance, stray circuit capacitances, and the inherent output capacitance of the radio frequency amplifier stage 12. Such capacitances are indicated by a phantom capacitor *49a*. It will be seen that a coupling capacitor 50 is connected between the plate 29 and the lead 47 of the resonant circuit 44.

Coupling between the resonant circuits 44 and 45 may be provided in any suitable manner. In this instance, the coupling is provided by a capacitor 51 which is connected between the high potential terminal leads 47 of the resonant circuits 44 and 45. Still another coupling capacitor 52 is connected between the high potential lead 47 of the resonant circuit 45 and a lead 53 extending to the mixer stage 13. It will be understood that the resonant circuit 45 is resonated by the distributed capacitance of its main coil 46 and the input capacitance of the mixer 13.

The tuning of the resonant circuits 44 and 45 may be varied in any known or suitable manner. Thus, it would be possible to provide variable tuning capacitors. However, in this instance, the main inductance coils 46 are variable over a range sufficient to cover the V. H. F. television bands or any other similar range of frequencies. The resonant circuits 44 and 45 are connected in a band pass arrangement so as to provide high selectivity.

The V. H. F. mixer 13 may be varied in construction, but is illustrated as comprising a pentode electron discharge tube 54 having a cathode 55, a control grid 56, a screen grid 57, a suppressor grid 58 connected directly to the cathode 55, and a plate or anode 59. The grid 56 is connected to the lead 53, and thence through the coupling capacitor 52 to the resonant circuit 45. In the usual manner a grid return resistor 60 is connected between the grid 56 and ground. The output of the V. H. F. oscillator 14 is fed to the control grid 56 by means of a small coupling capacitor 62. A phantom capacitor 49*b* is shown between the grid lead 53 and ground to represent the inherent input capacitance of the tube 54, stray circuit capacitances, and the distributed capacitance of the coil 46 in the circuit 45.

It will be seen that the cathode 55 is directly grounded. The screen grid 57 is bypassed to ground by a capacitor 65 and is connected to a suitable source of positive screen potential by a lead 66.

Plate potential is applied to the anode 59 by means of an inductance coil 67 connected between the plate and a lead 68 extending to a suitable source of positive plate voltage. The output of the mixer 13 is fed to the intermediate frequency amplifier by means of a coupling capacitor 69 connected to the plate 59. The coil 67 may be resonated at the intermediate frequency by the output capacitance of the tube 54.

Provision is made for selectively disabling the V. H. F. oscillator 14 and the U. H. F. oscillator 22. This might be accomplished in various ways, but in this instance, switches 70 and 71 are connected in series with leads 72 and 73 which supply the necessary plate voltage to the oscillators 14 and 22. Thus, the oscillators 14 and 22 are operative when the corresponding switches 70 and 71 are closed, but are disabled when the switches are open. It will be understood that one oscillator is operative while the other is disabled, the V. H. F. oscillator 14 being operative for V. H. F. operation and the U. H. F. oscillator 22 being operative for U. H. F. operation.

In this instance, the band transfer circuit 23 is operative to introduce additional inductance into the resonant circuits 44 and 45 so that they will be tunable to the operating frequency of the intermediate frequency amplifier 15. For U. H. F. operation, the resonant circuits 44 and 45 are adjusted to some predetermined setting, such as their lowest frequency setting, and the band transfer circuit 23 is brought into operation. The result is that the resonant circuits 44 and 45 are tuned to the intermediate frequency so that the radio frequency amplifier 12 and the V. H. F. mixer 13 will operate as additional intermediate frequency amplifiers.

The band transfer circuit 23 might be arranged in various ways, but in this instance it comprises twin circuit portions 74 and 75 which are effective to lower the operating frequencies of the resonant circuits 44 and 45, respectively. Each of the circuits 74 and 75 comprises a supplementary inductance coil 76 adapted to be connected into the corresponding resonant circuit. A lead 77 extends between one end of the supplementary coil 76 and the low potential terminal lead 48 of the main coil 46. The lead 77 may be of any reasonable and necessary length so that the supplementary coil 76 may be mounted with or adjacent the U. H. F. mixer 19 and oscillator 22 at some instance from the V. H. F. amplifier 12 and mixer 13. It is desirable to provide a grounded shield 78 around the lead 77. It will be recognized that the capacitance between the lead 77 and the shield 78 is in parallel with the capacitor 49. This capacitance is represented by the phantom capacitor 79. Accordingly, this capacitance can be compensated for merely by adjusting the value of the capacitor 49. The value of the capacitor 49 may be relatively large compared with the tube and stray capacitances between the high potential terminal 47 and ground. Thus, the tube and stray capacitances might range around 5 or 6 mmf., while the capacitor 49 might have a representative value ranging around 33 to 47 mmf.

Provision is made for selectively grounding the end of the supplementary coil opposite from the lead 77. This is accomplished in the present case simply by connecting a switch 80 between the supplementary coil 76 and ground, a separate switch being provided for each of the twin transfer circuits 74 and 75. It will be seen that the switches 80 are movable between open and closed positions. With the switches closed, the inductances of the supplementary coils 76 are introduced into the corresponding resonant circuits 44 and 45. When the switches 80 are open, the coils 76 are substantially out of the resonant circuits 44 and 45.

For U. H. F. operation, the switches 80 are closed so that the supplementary coils 76 will lower the operating frequency of the resonant circuits 44 and 45 to the intermediate frequency. The effect of the coils 76 is somewhat complex since each tends to be resonated at the intermediate frequency by the corresponding capacitor 49. In addition, the coils 46 and the tube and stray capacitances contribute to the overall resonance. When V. H. F. operation is desired, the switches 80 are opened so that the resonant circuits 44 and 45 will be tunable over the V. H. F. band. As indicated diagrammatically at 81, all of the switches 30, 70, 71 and 80 may be ganged together for common operation in changing over between V. H. F. and U. H. F. operation.

It will be recognized that the band transfer arrangement is efficient in operation yet is reasonably simple and low in cost. The supplementary coils 76 and the switches 80 may be mounted along with the U. H. F. mixer 19 and oscillator 22 on an optional unit 82 separate from the V. H. F. input circuit 16, amplifier 24, mixer 13 and oscillator 14 which may be on a V. H. F. unit 83. The resulting length of the interconnecting leads 77 does not have any disadvantageous effect. The inductance of these leads merely augments that of the supplementary coils 76. Likewise, the capacitance of the leads to ground merely augments the capacitance of the series capacitors 49. The switching arrangement requires a minimum of contacts and is extremely simple and dependable.

It will be recognized that various modifications, alternative constructions and equivalents may be employed without departing from the true spirit and scope of the invention as exemplified in the foregoing description and defined in the following claims.

I claim:

1. In a receiver for first and second widely separated relatively high and relatively low frequency bands, the combination comprising a radio frequency amplifying stage tunable over said low frequency band, a low frequency mixer operable in said low frequency band, an intermediate frequency amplifier having its input coupled to the output of said mixer and operable at a predetermined intermediate frequency below said low frequency band, low frequency input means operable in said low frequency band, a high frequency mixer stage operable in said high frequency band, means for selectively coupling either said low frequency input means or said high frequency mixer to the input of said radio frequency amplifier stage, tunable means for coupling the output of said radio frequency amplifier stage to the input of said low frequency mixer, said tunable means including a pair of mutually coupled resonant circuits tunable over said low frequency band, each of said resonant circuits including an inductance coil and a capacitor connected in series with said coil between one end thereof and ground, band transfer means for shifting each of said resonant circuits to said intermediate frequency for operating said radio frequency amplifier stage and said low frequency mixer as intermediate frequency amplifiers in conjunction with said high frequency mixer, said band transfer means including a supplementary inductance coil, a lead extending between one end of said supplementary coil and said one end of said first mentioned coil, a shield around said lead and connected to groud, the capacitance between said lead and said shield being effective to augment the capacitance of said capacitor, means for selectively connecting the other end of said supplementary coil to ground for introducing the inductance of said supplementary coil into said resonant circuit and thereby lowering the resonant frequency thereof, said supplementary coil effectively being out of said resonant circuit when said other end of said supplementary coil is not connected to ground.

2. In a receiver for a plurality of frequency bands, the combination comprising a radio frequency amplifier, a mixer, an intermediate frequency amplifier having its input coupled to the output of said mixer and operable at a predetermined intermediate frequency, coupling means connected between said amplifier and said mixer for coupling the output of said amplifier to the input of said mixer, said coupling means including a resonant circuit tunable over a band above said intermediate frequency, said resonant circuit including an inductance coil and a capacitor in series with said coil and connected between one end thereof and ground, transfer means for shifting the resonant frequency of said resonant circuit to said intermediate frequency for operating said amplifier and mixer as additional intermediate frequency amplifiers, said transfer means including a supplementary inductance coil, a lead extending between one end of said supplementary coil and said one end of said first mentioned coil, a shield around said lead and connected to ground so that the capacitance between said lead and said shield augments the capacitance of said capacitor, a switch operable between open and closed positions and being effective in said closed position to connect the other end of said supplementary coil to ground so as to introduce the inductance of said supplementary coil into said resonant circuit and thereby shift the resonant frequency thereof to said intermediate frequency, said supplementary coil effectively being out of said resonant circuit with said switch in said open position.

3. In a receiver for first and second widely separated relatively high and relatively low frequency bands, the combination comprising a radio frequency amplifying stage tunable over said low frequency band, a low frequency mixer operable in said low frequency band and operable to produce an output at a predetermined intermediate frequency below said low frequency band, low frequency input means operable in said low frequency band, a high frequency mixer stage operable in said high frequency band and effective to produce an output at said intermediate frequency, means for selectively coupling either said low frequency input means or said high frequency mixer to the input of said radio frequency amplifier stage, tunable means for coupling the output of said radio frequency amplifier stage to the input of said low frequency mixer, said tunable means including a pair of mutually coupled resonant circuits tunable over said low frequency band, each of said resonant circuits including an inductance coil and a capacitor connected in series with said coil between one end thereof and ground, band transfer means for shifting each of said resonant circuits to said intermediate frequency for operating said radio frequency amplifier stage and said low frequency mixer as intermediate frequency amplifiers in conjunction with said high frequency mixer, said band transfer means including a supplementary inductance coil having one end connected to said one end of said first mentioned coil, means for selectively connecting and disconnecting the other end of said supplementary coil to and from ground for introducing the inductance of said supplementary coil into said resonant circuit and thereby lowering the resonant frequency thereof, said supplementary coil effectively being out of said resonant circuit when said other end of said supplementary coil is disconnected from ground.

4. In a receiver for a plurality of frequency bands, the combination comprising a superheterodyne mixer operable to deliver an output at a predetermined intermediate frequency, said mixer having a control electrode with inherent capacitance between said electrode and ground, input means connected to said mixer and including a resonant circuit tunable over a band above said intermediate frequency, said resonant circuit including a variable inductance coil, substantially fixed capacitance means in series with said coil and connected between one end thereof and ground, and means connecting the other end of said coil to said electrode for resonance by said inherent capacitance, the capacitance of said fixed capacitance means being substantially greater than said inherent capacitance, means for coupling input signals to said resonant circuit, transfer means for shifting the resonant frequency of said resonant circuit to said intermediate frequency for operating said mixer as an intermediate frequency amplifier, said transfer means including a supplementary inductance coil, a lead extending between one end of said supplementary coil and said one end of said first mentioned coil, a switch operable between open and closed positions and being effective in said closed position to connect the other end of said supplementary coil to ground so as to introduce the inductance of said supplementary coil across said fixed capacitance means into said resonant circuit and thereby shift the resonant frequency thereof to said intermediate frequency, said supplementary coil effectively being floating and out of said resonant circuit with said switch in said open position.

5. In a receiver for a plurality of frequency bands, the combination comprising a superheterodyne mixer operable to deliver an output at a predetermined intermediate frequency, said mixer having a control electrode with inherent capacitance between said electrode and ground, input means connected to said mixer and including a resonant circuit tunable over a band above said intermediate frequency, said resonant circuit including a variable inductance coil, capacitance means in series with said coil and connected between one end thereof and ground, and means connecting the other end of said coil to said electrode for resonance by said inherent capacitance, the capacitance of said fixed capacitance means being substantially greater than said inherent capacitance, means for coupling input signals to said resonant circuit, transfer means for shifting the resonant frequency of said resonant circuit to said intermediate frequency for operating said mixer as an intermediate frequency amplifier, said transfer means including a supplementary inductance coil, a lead extending between one end of said supplementary coil and said one end of said first mentioned coil, a shield around said lead and connected to ground so that the capacitance between said lead and said shield augments the capacitance of said fixed capacitance means, a switch operable between open and closed positions and being effective in said closed position to connect the other end of said supplementary coil to ground so as to introduce the inductance of said supplementary coil across said fixed capacitance means into said resonant circuit and thereby shift the resonant frequency thereof to said intermediate frequency, said supplementary coil effectively being floating and out of said resonant circuit with said switch in said open position.

6. In a receiver for relatively high and low frequency bands, the combination comprising an amplifier having a signal handling electrode with inherent capacitance to ground, a resonant circuit connected to said electrode and tunable over said low frequency band, said resonant circuit including a variable inductance coil, substantially fixed capacitance means in series with said coil and connected between one end thereof and ground, and means connecting the other end of said coil to said electrode for resonance by said inherent capacitance, the capacitance of said fixed capacitance means being substantially greater than said inherent capacitance, transfer means for shifting the resonant frequency of said resonant circuit to a fixed intermediate frequency for operating said amplifier as an intermediate frequency amplifier, said intermediate frequency being substantially below said low frequency band, said transfer means including a supplementary inductance coil and a switch operable between open and closed positions and being effective in said closed position to connect the other end of said supplementary coil to ground so as to introduce the inductance of said supplementary coil across said fixed capacitance means and into said resonant circuit and thereby shift the resonant frequency thereof to said intermediate frequency, said supplementary coil effectively being floating and out of said resonant circuit with said switch in said open position.

7. In a receiver for relatively high and low frequency bands, the combination comprising an amplifier having a signal handling electrode with inherent capacitance to ground, a resonant circuit connected to said electrode and tunable over said low frequency band, said resonant circuit including a variable inductance coil, substantially fixed capacitance means in series with said coil and connected between one end thereof and ground, and means connecting the other end of said coil to said electrode for resonance by said inherent capacitance, the capacitance of said fixed capacitance means being substantially greater than said inherent capacitance, transfer means for shifting the resonant frequency of said resonant circuit to a fixed intermediate frequency for operating said amplifier as an intermediate frequency amplifier, said intermediate frequency being substantially below said low frequency band, said transfer means including a supplementary inductance coil, a lead extending between one end of said supplementary coil and said one end of said first-mentioned coil, a shield around said lead and connected to ground so that the capacitance between said lead and said shield augments the capacitance of said capacitance means, and a switch operable between open and closed positions and being effective in said closed position to connect the other end of said supplementary coil to ground so as to introduce the inductance of said supplementary coil across said fixed capacitance means and into said resonant circuit and thereby shift the resonant frequency thereof to said intermediate frequency, said supplementary coil effectively being floating and out of said resonant circuit with said switch in said open position.

References Cited in the file of this patent

UNITED STATES PATENTS

| | | |
|---|---|---|
| 2,141,756 | Linsell | Dec. 27, 1938 |
| 2,561,087 | Anderson | July 17, 1951 |
| 2,596,117 | Bell et al. | May 13, 1952 |
| 2,665,377 | Krepps | Jan. 5, 1954 |

UNITED STATES PATENT OFFICE

CERTIFICATE OF CORRECTION

February 10, 1959

Patent No. 2,873,360

Harold T. Lyman

It is hereby certified that error appears in the printed specification of the above numbered patent requiring correction and that the said Letters Patent should read as corrected below.

Column 1, line 27, for "470 to 890" read -- 54 to 216 --.

Signed and sealed this 2nd day of June 1959.

(SEAL)
Attest:

KARL H. AXLINE
Attesting Officer

ROBERT C. WATSON
Commissioner of Patents